United States Patent [19]
Brodmann et al.

[11] Patent Number: 4,530,876
[45] Date of Patent: Jul. 23, 1985

[54] WARP SIZING COMPOSITION, SIZED WARP STRANDS AND PROCESS

[75] Inventors: George L. Brodmann, Gibsonia; Ernest L. Lawton, Allison Park, both of Pa.

[73] Assignee: PPG Industries, Inc., Pittsburgh, Pa.

[21] Appl. No.: 522,756

[22] Filed: Aug. 12, 1983

[51] Int. Cl.$^3$ .............................. B32B 5/16
[52] U.S. Cl. .................................... 428/283; 65/3.1; 65/3.44; 252/8.8; 427/178; 427/389.9; 428/258; 428/268; 428/378; 428/392; 524/503
[58] Field of Search .............. 427/178, 389.8; 19/149; 28/179; 242/18 G; 65/3.1, 3.44; 428/251, 258, 268, 392, 378, 240, 283; 252/8.6, 8.8; 524/503

[56] References Cited

U.S. PATENT DOCUMENTS

| | | | |
|---|---|---|---|
| B 415,590 | 3/1976 | Chase et al. | 428/378 |
| 3,189,578 | 6/1965 | Kuemmerer | 260/77.5 |
| 3,427,192 | 2/1969 | Bolinger | 252/8.8 |
| 3,627,714 | 12/1971 | Merki | 260/18 TN |
| 3,875,118 | 4/1975 | Meisert et al. | 260/75 NP |
| 3,907,736 | 9/1975 | Barton et al. | 428/354 |
| 3,925,290 | 12/1975 | Matsuo et al. | 524/503 |
| 4,066,591 | 1/1978 | Scriven et al. | 428/395 |
| 4,123,422 | 10/1978 | Erikson et al. | 528/273 |
| 4,137,209 | 1/1979 | Wong et al. | 428/442 |
| 4,143,091 | 3/1979 | Chang et al. | 428/425 |
| 4,148,779 | 4/1979 | Blackwell et al. | 8/92 |
| 4,154,891 | 5/1979 | Porter, Jr. et al. | 428/334 |
| 4,158,083 | 6/1979 | Login | 428/389 |
| 4,172,930 | 10/1979 | Kajitani et al. | 525/56 |
| 4,185,138 | 1/1980 | Graham | 428/391 |
| 4,208,494 | 6/1980 | Chang et al. | 525/440 |
| 4,208,495 | 6/1980 | Chang et al. | 525/440 |
| 4,215,026 | 7/1980 | Login | 428/395 |
| 4,235,764 | 11/1980 | Dereser et al. | 524/503 |
| 4,251,403 | 2/1981 | Rees | 428/395 |
| 4,276,044 | 6/1981 | Dieterich | 260/29.2 TN |
| 4,304,900 | 12/1981 | O'Neill | 528/299 |
| 4,309,510 | 1/1982 | Kleber | 252/8.8 |

OTHER PUBLICATIONS

Fabric Forming Systems by Peter Schwartz, Trevor Rhodes and Mansour Mohamed, School of Textiles, N. Carolina State University, Raleigh, North Carolina, Noyes Publications, Park Ridge, NJ.
Poly(Vinyl Alcohol), Encyclopedia of Polymer Science and Technology, vol. 14, pp. 175–183, Copyright 1971, John Wiley & Sons, Inc.
Poly(Vinyl Alcohol), Kirk & Othmer Encyclopedia of Chemical Technology, vol. 21, pp. 353–364, 2nd Edition.
Polyblends, Encyclopedia of Polymer Science and Technology, vol. 10, pp. 694–709, Copyright 1971 by John Wiley & Sons, Inc.
Sizing, Encyclopedia of Polymer Science and Technology, vol. 12, pp. 585–613, Copyright 1971 by John Wiley & Sons, Inc.
Aqueous Emulsions, Dispersions and Solutions of Polyurethanes; Synthesis and Properties by D. Dieterich, Polyurethane Division, Research, Bayer AG, Copyright Elsevier Sequoia S. A. Lausanne, The Netherlands pp. 281–340.
Removal Procedures for Eastman ® WD Polyester used in Sizing Applications, Publication No. J–175C, Apr. 1980, Eastman Chem. Products, Inc. Kingsport, TN.
Sizing of Polyester Filament Yarns with Eastman ® WD 3652 Water Dispersible Polyester, Pub. No. J–171C, Apr. 1980m Eastman Chem. Prod., Inc., Kingsport, TN.
Vinol ® Polyvinyl Alcohol Adhesives, Air Products and Chemicals, Inc., 1976.
Vinol ® Polyvinyl Alcohol Miscellaneous Applications, Air Products and Chemicals, Inc., 1976.

*Primary Examiner*—James J. Bell
*Attorney, Agent, or Firm*—Kenneth J. Stachel

[57] ABSTRACT

Warp sizing compositions are used to treat textile yarn to withstand the abrasive forces encountered by the warp yarn during weaving. A warp sizing composition having poly(vinyl alcohol); and a second film forming polymer, which is water soluble, dispersible or emulsifiable and having a Tg of less than 70° C., and an average particle size of less than 5 microns, and being dispersible with poly(vinyl alcohol); and water results in treated yarn having good flexibility, and abrasion resistance strength. The more flexible treated warp yarn encounters less damage during the slashing operation to result in improved weaving performance. The process for producing glass fiber strand yarn treated with the warp sizing composition involves forming the glass fibers, treating the glass fibers with a forming size, gathering the glass fibers into one or more strands, collecting the strands, drying the strands to remove enough moisture to enable the strands to be removed from the collected strand package, rewinding the strands, beaming a plurality of the rewound strands, treating the plurality of rewound strands from a beam with the warp sizing composition, drying the treated strands, splitting the dried treated strands and winding the split strands onto a beam.

20 Claims, No Drawings

WARP SIZING COMPOSITION, SIZED WARP STRANDS AND PROCESS

The present invention is directed to an aqueous based composition for treating textile yarn that is to be used as the warp in weaving textile fabric. As another aspect, the present invention is directed to the treated warp glass fiber strand yarn. As an additional aspect, the present invention is directed to a process for producing treated glass fiber strand warp yarn.

For the production of woven textile fabric, where the textile material is glass fiber strand yarn, the glass fiber strand yarn is prepared from continuous glass fibers. The continuous glass fibers are manufactured by drawing myriad glass filaments from an electrically heated bushing containing a molten supply of glass. The glass passes through tipped orifices in the bottom of the bushing and forms inverted cones of glass at the ends of the tips. Individual filaments are drawn from the cones of glass at a high rate of speed, for example, 5,000 to 20,000 feet per minute. An aqueous chemical treating composition having at least a lubricant and possibly additional components such as: film forming polymers like starch or synthetic polymers, emulsifiers, and wetting agents are applied to the glass fibers by an applicator roll, belt or spray. This aqueous chemical treatment is known as a forming size, and the treatment assists in bonding the filaments together and in maintaining the integrity of a bundle of filaments known as a strand. The forming size is deposited on the filaments to provide a level of forming size solids of about 0.1 to about 3 percent by weight based on the weight of the glass. The treated filaments are grouped into a bundle of filaments, strands, as they pass over a suitable guide. The strand is wound on a tube present on the winder, which provides the force to attenuate the fibers from the molten glass. The strand usually is wound in a slight traverse so that succeeding turns cross each other at an angle, rather than being parallel to each other so that the strand can be more easily removed from the tube. The wound strand on the tube is referred to in the art as a forming package.

A plurality of the forming packages are dried or allowed to air dry to reduce the moisture content of the strands so that they can be removed from the forming packages. After the plurality of forming packages are dried, the strand from each forming package is unwound onto a bobbin, usually on a twist frame to impart a twist to the strand or in a rewinding operation to impart a false or zero twist to the strand. When the rewound or twisted strand, usually referred to as yarn, is to be used for textile applications, two standard processes are employed to prepare the yarn. A plurality of bobbins are mounted on racks and the strand at the end of each bobbin is threaded through a tensioning disc and through a plurality of guide eyes and over a separating cone and onto a beam which is a large cylinder. The plurality of yarn ends are wound in parallel on this beam, which process is known as beaming. The yarn of the beam is used for the warp of a textile glass fiber fabric. The weft of the textile glass fiber fabric, which is woven generally perpendicularly into parallel strands coming off of the beam is supplied from bobbin packages by a quill mounted in a shuttle loom or by an air jet in a air jet loom to weave the weft yarn into the warp yarn.

In weaving fabric or cloth from glass fiber strand yarn or any other textile yarn, the warp yarn, which is an exclusive term referring to the lengthwise running yarns in the woven fabric, are subjected to considerable abrasion from the moving parts of the weaving loom. Abrasion to the warp yarn can result from the guide surfaces of split rods, drop wires, confuser bars, heddles, reeds, shuttles and adjacent yarns in the loom. For example, in a shuttle loom the weft yarn is woven through the warp at around 80 to 100 picks per minute. A pick is one pass of the weft yarn through the warp yarn. After each pass of the weft yarn, the reed of the loom that has projections extending down between each individual warp yarn moves in a parallel direction to the warp yarn along the entire width of the warp yarn to move the weft yarn closer together. This movement of the reed along the warp yarn causes some abrasion to the warp yarn. The abrasion to the warp yarn in an air jet loom is even greater than in a shuttle loom. In an air jet loom, the weft is placed in the warp at 350–450 picks per minute. Therefore, the confuser bar or reed is moving up and down along the warp yarn at 350 to 450 times a minute, thus increasing the occurrence of abrasion to the warp yarn. To protect the warp yarn from abrasion and to reduce the damage or imperfections of the woven fabric or cloth, the warp yarns are usually treated with a chemical treatment known as a slashing size.

Slashing is the operation wherein the slashing sizing composition is applied to the warp yarn as one or more sheets of yarn are supplied from one or more supply beams of yarn that are held by creels on the slashing machine. The myriad yarn ends, generally on the order of 200 to 500 per beam from several beams, are brought together so as to form one or more sheets of yarn of about 1500 to 8000 ends. These sheets then enter a size box, wherein they are guided through the sizing solution and through one or more sets of squeeze rolls to remove the surplus size, which then falls back into the size box. After the yarn has been exposed to the slashing size composition, the yarn must be dried. The drying is usually accomplished by passing the yarn through a heated chamber or over the surfaces of internally heated drying cylinders, cans. The cans can have a non-stick surface to reduce any sticking of the yarn to the cans. The dried yarn is then separated into individual yarn segments for use as the warp yarn in weaving by means of horizontal split rods, which separate the yarn into sections corresponding to those of the original beams. The yarn is then recombined when passed through a vertical comb and thereupon onto a take-up beam referred to as a weaver's beam or loom beam. This loom beam holds the yarn until such time as it is used in the weaving process.

Conventional chemical formulations used as slashing size compositions have film forming adhesive materials such as polysaccharides, like starch and starch derivatives; and proteins, such as gelatin and casein; and poly(vinyl alcohol) both fully and partially hydrolyzed and plasticized poly(vinyl alcohol), wherein sugar, urea and thiourea have been used as the plasticizer. Also, the slashing size formulations may have one or more lubricants present in addition to the film forming adhesive polymer.

Once the fabric is woven, the fabric has the warp yarn that has present a forming size composition and a slashing sizing composition and has a weft yarn which has present only a forming sizing composition. The additional coating of the slashing size on the warp yarn would result in different surface properties between the warp and weft yarns in the same fabric. Such differences would cause imperfections in dying of the fabrics or in the handle and feel of the fabrics or in the electrical and reinforcement properties of the fabrics used in electric circuit boards. Therefore, the fabrics are heat cleaned to remove both the forming and slashing sizing compositions and to set the yarns in the fabric. For glass fiber strand fabrics, this heating is usually conducted at temperatures of around 900° to 1300° F. (approximately 482° C. to around 705° C.) for around 10 to 180 seconds or longer to volatilize the solids and remove them from the fabric and to soften the glass fibers in the fabric to set them in their new positions. Such a process is described in greater detail in U.S. Pat. No. 2,845,364.

In the slashing operation, the adhesive characteristic of the slashing formulation causes the individual yarns in the treated sheet of yarns to stick together. In separating the treated yarns into distinct yarn segments for use as warp yarn in weaving, the treated yarns are split from each other, as aforementioned, usually after drying the treated yarn. The current film forming polymers used in slashing formulations, such as poly(vinyl alcohol), can give a film on the warp yarn that becomes so sticky and tough or brittle that when the adjacent warp yarns are separated one from another and also, if more than one sheet of yarn has been placed in the sizing box at the same time, when the sheets of yarns are separated from other horizontal sheets of yarns, the separation can damage the individual treated yarns. The damage results in the production of fuzz in the weaving operation and in the woven cloth and can lead to additional abrasion occurring to the damaged warp yarn leading to further fuzzing and deterioration of the yarn and resulting in a poorer fabric grade or even shutting down of the loom because of the defective yarn.

The art has attempted to assuage this problem by the use of plasticized poly(vinyl alcohol) in the slashing size in lieu of the poly(vinyl alcohol) to reduce the toughness and adhesiveness of the treated warp yarn and to make the warp yarn more flexible and to reduce the damage occurring to the treated warp yarn in the dry splitting operation during slashing. The achievement of this improvement with the plasticized poly(vinyl alcohol) type slashing formulations also leads to attendant disadvantages. These disadvantages are that the treated warp yarn has reduced abrasion resistance which results in more loom stops during weaving and in a woven fabric having more defects.

It is an object of the present invention to provide a slashing size formulation or warp size formulation for textile strands that reduces damage to the yarns from dry splitting, and improves the abrasion, resistance and weavability of the sized yarns.

It is an additional object of the present invention to provide treated glass fiber strand yarn having good protection from damage due to tack bonding of adjacent yarns during the slashing operation to produce treated glass fiber strand yarn having good weavability and abrasion resistance.

It is another additional object of the present invention to provide a process for producing glass fiber strand warp yarn useful in weaving for improved weaving efficiency and for manufacture of glass fiber strand fabric with fewer imperfections.

SUMMARY OF THE INVENTION

Accordingly, the foregoing and other objects of the present invention are obtained by an aqueous-containing, warp sizing, chemical composition; chemically treated textile yarn; and process, wherein the aqueous containing chemical composition has solubilized, emulsified or dispersed poly(vinyl alcohol) and one or more water emulsifiable or dispersible second film forming polymers having a glass transition temperature (Tg) of less than around 70° C., and present in an average particle size of less than 5 microns and having good dispersibility in poly(vinyl alcohol) by virtue of chemical interactions such as at least permanent dipole and hydrogen bonding interactions. In addition, the composition can have one or more lubricants and one or more plasticizers. In addition to the types of polymers present, the amounts of the components in the composition are such that, when a film is formed upon the textile yarn, the matrix or continuous phase of the film on the yarn is composed of poly(vinyl alcohol) and the second film forming polymer is dispersed in the poly(vinyl alcohol) in a manner ranging from homogeneously as fine particle size particles to small interpenetrating domains of fine particles.

Another aspect of the invention is the treated glass fiber warp yarn having the film of poly(vinyl alcohol) and second film forming polymer as aforedescribed surrounding the periphery of the yarn. The fibers constituting the yarn, which is encapsulated with the film, have a dried residue of at least one or more lubricants and may also have one or more film forming polymers, one or more silane coupling agents, one or more emulsifying agents, one or more wetting agents and the like.

Another aspect of the present invention is the process for producing warp glass fiber yarn involving forming the glass fibers, applying a forming size composition to the fibers, gathering the fibers into one or more strands, winding the strands into a package, drying the packages, rewinding the strands and the packages with or without imparting a twist, beaming a plurality of the rewound packages, and slashing a plurality of the yarns from one or more beams of the rewound yarn. In this process, the forming size applied to the fibers has at least one or more lubricants, and may have, in addition thereto, one or more film forming polymers, one or more silane coupling agents, one or more wetting agents and one or more emulsifying agents. The wound packages of gathered glass fibers are dried to remove moisture to enable the strand to be unwound from the package onto bobbins. In the slashing step, a slashing sizing composition is applied to a plurality of the rewound yarn in sheet form and the sheet of yarn is dried and the dried yarn is then split into individual segments of yarn that constitute the warp yarn. In addition, before beaming in this process, the rewound glass fiber strand can be bulked into texturized single end or multiple end glass fiber strand yarn. Also, in the slashing step, the sheet of yarn that is treated with the slashing sizing formulation can be predried to remove some of the moisture and then split into the individual yarn segments and then further dried. The slashing sizing formulation is comprised of water solubilized, emulsified or dispersed poly(vinyl alcohol) and a second water emulsifiable or dispersible film forming polymer having a Tg less than 70° C. and present in an average particle size of less than 5 microns, which is dispersible in a film of poly(vinyl alcohol) in a manner ranging from homogeneously as fine particle size particles to small interpenetrating domains of fine particles. In addition, the slashing formulation may have one or more lubricants and- /or one or more plasticizers. Also the slashing formulation has present an amount of water.

DETAILED DESCRIPTION OF THE INVENTION AND PREFERRED EMBODIMENT

By the term "film forming polymer", it is meant any polymeric material that can form a film from evaporation of a carrier or solvent or from a chemical reaction to cure the polymeric material into a film. In the use of the term "glass transition temperature" (Tg) this characteristic of a material can be determined by differential thermal analysis or approximated by techniques such as nuclear magnetic resonance peak ratio analysis. The term "homogeneous" is meant to include molecular blends as well as a dispersed fine particle phase randomly dispersed in a continuous phase. For the purposes of this invention, the term "tack" is defined as the property of an adhesive that enables it to form a bond of measurable strength immediately after adhesive and adherend are brought into contact at low pressure. The term "non-tack" is defined as the absence of tack or stickiness or the tendency to adhere. The measurement of tack is made at the tack temperature, which is defined as the lowest temperature at which the two films of polymers in contact will just fuse under a pressure of 20 pounds per square inch which is applied for 2 seconds, (A. D. Maclaren et al., Journal Polymer Science, 7, 463, 1951) and the absence of tack is demonstrated by touch.

It has been discovered that damage to adjacent slashed yarns that occurs during the splitting step of the slashing operation, results from the separation not being between the surface of the film on one yarn and the surface of the film of the other yarn. The separation actually involves the taking of some of the surface film from one or the other of the yarns at a particular contact point along the yarn probably due to tack bonding. When the surface film is separated from the yarn invariably one or more fibers or strands and sometimes up to around 10 fibers or more are removed from the yarn. These damaged areas of the yarn can lead to the generation of fuzz in weaving.

It is believed without limiting the invention that the aqueous warp sizing achieves better film properties and flexibility without sacrificing integrity or strength of the coated textiles because of the presence of the second film forming polymer along with the poly(vinyl alcohol). The presence of the second film forming polymer with a Tg of less that 70° C. lowers the yield strength for rupturing a film formed from the poly(vinyl alcohol) and second film forming polymer from a film formed from poly(vinyl alcohol) alone. The lowering of the yield strength is not to such a great extent as that for a film formed from poly(vinyl alcohol), where a plasticizer is present. Since the yield strength of the film is not reduced to too great an extent and since the second film forming polymer contributes an adhesive character to the poly(vinyl alcohol) film, the tensile strength of the film formed from the poly(vinyl alcohol) and second film forming polymer is not reduced to the extent of the reduction in tensile strength of a plasticized poly(vinyl alcohol) film. In this manner, it is believed that the second film-forming polymer contributes to the abrasion resistance of textile material coated with a film of poly(vinyl alcohol) and second film forming polymer. The degree of flexibility of the film which results from the warp sizing composition can be varied by the amount of the second film forming polymer present in the warp sizing composition. This allows for a measure of variability depending on the construction of the yarn such as the filament diameter, the number of filaments per strand, and the twist present in the textile yarns to be treated with the warp sizing composition.

Glass fiber strand yarn having a film resulting from the warp sizing composition, where the film encapsulates the yarn more than penetrates the yarn bundles, is adequately protected against abrasion forces that the warp yarn will encounter in a weaving loom. The film encapsulating more than penetrating the yarn has a homogeneous continuous phase of poly(vinyl alcohol) with five microns or less domains of the second film forming polymer interpenetrating the continuous phase and dispersed in the poly(vinyl alcohol) matrix. Such a blend of the poly(vinyl alcohol) and second film forming polymer to allow for the interpenetration of the phases provides for favorable interphase adhesion to result in good abrasion resistance of the treated glass fiber strand yarn but providing increased flexibility over that which would be provided with the poly(vinyl alcohol) alone. The glass fiber strand yarn having a film resulting from the warp sizing composition also has good hardness for weaving and also has good heat cleanability and can be made to have good slashing characteristics so that there is little or no residue that would interfere with the use of the woven glass fiber strand fabric in electric circuit boards. Although the warp sizing composition results in glass fiber strand yarn having good properties of strength, hardness and heat cleanability so that the sized glass fiber strand yarn treated with the aqueous warp sizing composition in a slashing operation has improved performance in weaving, the use of the blend of poly(vinyl alcohol) and the second film forming polymer may have one or more characteristics to make its use desirable with other textile materials such as polyesters, and cellulosic fibers like cotton and regenerated cellulose such as rayon and its blends and the like.

The process for providing warp glass fiber strand yarn utilizes the warp sizing for treating glass fiber strand yarn composed of glass fibers already having present the dried residue of a forming size. The process can be used with continuous glass fiber strand yarn, bulked glass fiber strand yarn or texturized glass fiber strand yarn. Also the process can involve the dry splitting of the glass fiber strand yarn treated with the warp sizing or the wet splitting of the yarn treated with the warp sizing composition. Although more of an improvement because of the warp slashing size is recognized in dry slashing.

The blend of the poly(vinyl alcohol) and second film forming polymer can utilize a poly(vinyl alcohol) that is water soluble, emulsifiable or dispersible. The poly(vinyl alcohol) may have a low, medium or high molecular weight which ranges from about 22,000 to greater than 105,000 weight average molecular weight. The poly(vinyl alcohol) can be fully or partially hydrolyzed. Also, mixtures of various molecular weight and hydrolyzed poly(vinyl alcohols) can be used. The poly(vinyl alcohol) can be formed from poly(vinyl acetate) by hydrolysis or ester interchange reactions, and such a starting material should be polymerized in such a manner known to those skilled in the art to approach the desired molecular weight of the poly(vinyl alcohol). The poly(vinyl acetate) used as a starting material to produce the poly(vinyl alcohol) should not be such that the resulting poly(vinyl alcohol) has a high degree of crystallinity.

The higher the degree of crystallinity of the poly(vinyl alcohol) the less the solubility in water.

The solid poly(vinyl alcohol) with a percent of hydrolysis in the range of about 87 to about 89 percent and with not too high of a degree of polymerization, will be easily soluble in water. For the poly(vinyl alcohol) having a higher degree of polymerization or a higher percentage of hydrolysis, the polymer can be prepared into an aqueous emulsion or dispersion by any techniques known to those skilled in the art. For example, a fully hydrolyzed poly(vinyl alcohol) that is one having about 98 to around 98.8 percent hydrolyzation is soluble only in hot to boiling water. If the fully hydrolyzed poly(vinyl alcohol) is to be combined with water at room temperature, an emulsion or dispersion of the polymer will have to be used. In forming an oil-in-water emulsion of the poly(vinyl alcohol), such solvents as acetone or normal propanol can be used to improve water stability. When the partially hydrolyzed poly(vinyl acetate) is used, the water solution of the poly(vinyl alcohol) can be prepared at room temperature and need not be in the form of an emulsion or dispersion, unless higher amounts of poly(vinyl alcohol) are to be present in the solution and water would be a minor component. Generally, the poly(vinyl alcohol) will not dissolve in cold water, but it can be dissolved in warm or hot water and cooled with agitation so it does precipitate. With some residual acetate groups on the poly(vinyl alcohol) like those present where the degree of hydrolysis is around 87–89 percent renders the poly(vinyl alcohol) more soluble in water. But with further increasing of the number of acetate groups on the poly(vinyl alcohol), the solubility in water of the much less hydrolyzed polymer decreases. For example, poly(vinyl alcohol) with 30 mole percent acetate (50 percent hydrolyzed) is soluble only in a water-alcohol mixture.

In the resulting solution, emulsion or dispersion of poly(vinyl alcohol) and water, the viscosity should be such that the warp sizing composition can be used as a coating. Therefore, the degree of polymerization of the poly(vinyl alcohol) should range from around 500 to 2500 so that the viscosity is in the range of about 5 to about 200 centipoise. If necessary, viscosity stabilizing agents can be added to the poly(vinyl alcohol) solution, emulsion or dispersion. The amount of poly(vinyl alcohol) present in the water solution, emulsion or dispersion is in the range of about 5 to 25 weight percent. Lower amounts of the poly(vinyl alcohol) may not form a film on the textile material and higher amounts may produce solubility problems.

An example of a poly(vinyl alcohol) is a low molecular weight poly(vinyl alcohol) having a weight average molecular weight from about 25,000 to about 35,000 with 1 percent residual acetate groups and less than 5 percent methyl methacrylate comonomer present to flexibilize the polymer. An example of a commercially available poly(vinyl alcohol) that can be used is Elvanol T-66 poly(vinyl alcohol) for the low molecular weight type which is available from E. I. duPont de Nemours Co. A medium molecular weight type of poly(vinyl alcohol) that is 87–89 percent hydrolyzed is Vinol 53 material, which is the preferred poly(vinyl alcohol) available from Air Products and Chemicals, Inc. Preferably, the amount of poly(vinyl alcohol) in the water solution is around 8 weight percent.

The second film forming polymer having a Tg of less than 70° C. and present in the form of an aqueous emulsion or aqueous dispersion having a fine particle size of less than 5 microns is blended with the aqueous solution, emulsion or dispersion of the poly(vinyl alcohol). Also the second film forming polymer must have a desired amount of flexibility and dispersibility in the poly(vinyl alcohol) film. In addition, the aqueous blend of the second film forming polymer and poly(vinyl alcohol) should be stable for at least more than 24 hours. The second film forming should contribute to the overall strength of the film from the blend of poly(vinyl alcohol) and second film forming polymer. This strength is achieved if the second film forming polymer forms a film on its own that has a tensile strength of at least about 500 psi. In addition the second film forming polymer must be dispersible with the poly(vinyl alcohol) in the film on the yarn. This dispersibility can range from a homogeneous blend on a molecular level or a random discontinuous phase of second film forming polymer in a continuous phase of poly(vinyl alcohol) to a dispersion of fine particle size particle domains of the second film forming polymer interpenetrating the continuous phase of the poly(vinyl alcohol) film. The second film forming polymer has this dispersibility from its similaritty with poly(vinyl alcohol) so that at least permanent dipole and hydrogen bonding interactions between the second film forming polymer and the polyvinyl alcohol are effected. Nonexclusive examples of the second film forming polymer are polyurethane polymers and copolyester polymers that are water soluble, emulsifiable or dispersible by the presence of ionic groups on the polymer or by internal or external emulsification of the polymer.

Nonexclusive examples of the polyurethane polymers that can be used as the second film forming polymers are those that are internally emulsified, examples of which are shown in U.S. Pat. Nos. 4,143,091; 4,208,494; and 4,208,495, all of which are hereby incorporated by reference. Other types of polyurethane polymers that can be used are those having ionic groups present on the polymer molecular such as those disclosed in U.S. Pat. No. 4,066,591, which is hereby incorporated by reference.

Other types of polyurethane ionomers, e.g. polyurethane polymers having ionic groups present on the polymer, that can be used in the composition of the present invention include polyurethane ionomers such as anionomers and cationomers. Nonexclusive examples of the ionomers include anionomers that are produced by reacting organic diisocyanates having molecular weights of from about 160 to about 300 with tri and/or tetraalkylene polyol such as ethylene glycol, and optionally other aliphatic glycols having molecular weights of from about 62 to about 200 in the presence of glycols containing carboxyl, carboxylate, sulfonic acid and/or sulfonate groups and having molecular weight of less than around 500. These polyurethane polymers containing the ionic groups or hydrophilic polyether segments are self-emulsifiable and do not need emulsifiers or high shear forces to be emulsified or dispersed, since they are self-dispersing. Also cationic polyurethanes that are formed by quaternizing polyaddition reactions can be used. Combinations of the ionic polyurethanes with polyesters, polyethers, polyacetals, polyisocyanates, low molecular weight glycols and diamines can also be used. The type and amount of the ionic groups present in the ionic polyurethanes are selected so that the polyurethane is not only self-dispersing but that the particle size of the polyurethane is less than 5 microns. The properties of these polyurethane polymers can vary from hard film properties to flexible film properties. It is those polymers with the flexible film properties that are most useful in the present invention. Examples of the polyurethane polymers that can be used include the aliphatic polyurethane dispersions such as Witcobond W-212 and W-234, available from Witco Chemical Corporation. The Witcobond W-212 material has a milky white appearance with a 30 percent solids level and a density of 8.7 lb/gal. The flash point is greater than 100° C., and the particle charge is cationic and the particle size is 1 μm. The pH at 25° C. (77° F.) is 4.5, and the viscosity at 25° C. (77° F.) in Brookfield LVF (cps) is 50, and the surface tension in dynes/cm is 41. The preferred polyurethane used in the present invention is the Witcobone W-234 polyurethane, available from Witco Chemical Corporation. The W-234 polyurethane is translucent in appearance and aliphatic in chemical nature. The solids is 30 percent, and the density is 8.8 lb/gal. The flash point is similar to the W-212 material, and the particle charge is anionic, while the dispersion is colloidal. The pH at 25° C. (77° F.) is 8.0, and the viscosity at 25° C. (77° F.) as measured by Brookfield LVF at a cps is 100, and the surface tension in dynes/μcm is 54. Another polyurethane is the Witcobond W-290H material, which is similar to the W-234 material except that it has a 65 percent solids level and a particle size of around 2 μm and a pH of 7.5 and a viscosity of 200 cps and a surface tension of 42 dynes/cm.

Another second film forming polymer with the desired glass transition temperature that can be used in the present invention are the amino sulfonated linear, water dispersible copolyesters and polyester amides. These materials are produced from dicarboxylic acid, glycol, polyoxyalkylene glycol, and amino disulfonamido compounds. Also these copolyesters can have carboxyl interconnecting groups. Examples of these commercially available copolyesters are Eastman ® polyesters with the grade designation MPS 7726 and WD 3652, usually available as 30 percent aqueous dispersion. The amount of the second film forming polymer in water can be any amount that is maintainable in an emulsion or dispersion form in an aqueous emulsion. Preferably, the amount is in the range of about 5 to about 50 weight percent.

The blend of the poly(vinyl alcohol) and second film forming polymer is accomplished in an aqueous environment, wherein the ratio of the two polymers in the blend can range from about 1:1 to about 99:1 poly(vinyl alcohol) to second film forming polymer. The amount of water in the blend is that necessary to give a total solids for the blend and other components of the slashing size in the range of about 3 to about 25 weight percent and most preferably about 8 to about 10 weight percent. If too much water is present, the poly(vinyl alcohol) may not form a continuous film. Preferably, the water is deionized water or distilled water, but tap water can also be used. The amount of the second film forming polymer present in the blend ranges from about 5 to about 40 and preferably about 5 to about 20 weight percent of the total solids of the slashing or warp size composition. The amount of polyvinyl alcohol in the composition should always be a major amount of the solids to keep the total solids from being too close to a 50:50 blend of poly(vinyl alcohol) and second film forming polymer, where a masking of the properties contributed by each material may occur.

In addition to the poly(vinyl alcohol) and second film forming polymer and water, the slashing size formulation may also include any material known to those skilled in the art to be useful in the slashing size formulations. Nonexclusive examples of these include any compatible lubricant such as, for instance, higher aliphatic acids, waxes, mineral oils both blown or unblown, drying and semi-drying vegetable and animal oil fats. Nonexclusive examples of the higher aliphatic acids include: aliphatic carboxylic acids having lubricating properties, such as straight chain fatty acids with 12 to 32 carbon atoms like lauric, myristic, palmitic, margaric and stearic acid and dicarboxylic acids such as azelaic and pimelic acid and hydroxylated derivatives thereof and mixtures thereof. Nonexclusive examples of waxes include: spermaceti wax, tallow, Japan wax, beeswax, polyether waxes, polyester waxes, paraffin wax and mixtures thereof. The amount of lubricant that can be used in the slashing size is from about 0.1 to about 1.5 and preferably about 0.2 to about 1 weight percent of the total aqueous warp sizing composition.

Another additional component that may be present in the slashing sizing composition is one or more plasticizers. Nonexclusive examples of plasticizers that can be used include ethylene glycol, mono or disaccharides such as sucrose and sorbitol, urea, thiourea, mixtures of mono or disaccharides and urea, and amine oxides derived from natural fatty acids, which often have mixtures of products of different lengths of alkyl chains generally characterized by the formula

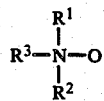

where $R^1$ is an alkyl group having 1 to 22 carbon atoms, and $R^2$ is also such an alkyl group or a group of the formula $-(CH_2CH_2O)y\ H$ with y being an integer from 1 to 5, and $R^3$ is an alkyl group having 1 to 5 carbon atoms or a group of the formula $-(CH_2CH_2O)x\ H$ where x is an integer from 1 to 10, and if $R^2$ is an alkyl group having more than 5 carbon atoms, the sum of Y and X is not greater than 10. Amounts of the plasticizer present in the slashing size formulation are generally in the range of about 0.2 to about 2.0 and preferably around 0.5 to about 1 weight percent to the total aqueous warp size composition. In the preferred embodiment of the present invention, it is not necessary to include a lubricant or a plasticizer to achieve the resultant benefits of the present invention.

The slashing size formulation can be prepared by any method known to those skilled in the art for blending polymers in the presence of water. If the polymers are only moderately soluble in water, then hot water or cosolvents can be used to form emulsions and dispersions. The poly(vinyl alcohol) is solubilized, emulsified or dispersed in water. Preferably, the poly(vinyl alcohol) is partially hydrolyzed around 87 to about 89 percent and of a medium molecular weight of around 77,000 to 79,000 weight average molecular weight and is cold water soluble. Antifoaming agents can be used if too much foam is produced in solubilizing, emulsifying or dispersing the poly(vinyl alcohol). The poly(vinyl alcohol) is solubilized, emulsified or dispersed with agitation. Preferably, even the cold water soluble poly(vinyl alcohol) is cooked at a temperature of around 210°

F. (99° C.) for around 30 minutes. Poly(vinyl alcohol) is then cooled by adding cold water and using an air mixer to rapidly evaporate heat from the mix to approximately 155° (68° C.) to 160° F. (71° C.). The second film forming polymer and any additional components are added at or under this temperature with agitation and cold water is added to bring the mix to the final desired volume and total solids amount.

The slashing size formulation can be applied to glass fiber yarn, polyester yarn and regenerated cellulose type yarns and the like to name just a few. It is preferred to use the glass fiber yarns, where the glass fibers have already been sized with a forming size to allow for twisting or rewinding of the strands from forming packages onto textile type packages such as bobbins. The glass fibers can be of any fiberizable glass composition, for example, "621" or "E" glass compositions and low or zero boron and fluorine derivatives thereof. The filament diameter of the glass fibers can be any filament diameter known to those skilled in the art for use in the textile industry and the construction of the strand, that is, the number of fibers in the strand, can be of any construction known to those skilled in the art. Preferably, the filament diameter is around 4 to around 16 microns and the construction of the strand is around 200 to around 2,000 or more filaments per strand and preferably, the yarn is twisted. The dried residue of the forming size present on the fibers can be any forming size known to those skilled in the art for use in the glass fiber textile industry. Nonexclusive examples of such sizing compositions include starch-oil sizing compositions including modified type starches known to those skilled in the art or any forming size composition having the requisite lubricant such as wax and/or cationic lubricants alone or in addition to film forming polymers such as poly(vinyl alcohol) and poly(vinyl acetate) and the like. Other components that could be used in the forming size for glass fibers include: poly(alkylene oxides) like poly(ethylene)oxide and modified starches such as hydroxyethylated starches and amine modified starches, and other modified starches typically used in manufacturing glass fibers. Examples of forming size compositions that can be used on the glass fibers that are to be treated with the slashing size formulation of the present invention are those disclosed in U.S. Pat. Nos. 3,227,192 (Griffiths); 3,932,193 (Graham); 4,002,445 (Graham); 4,066,106 (Graham); 4,197,349 (Walser); 4,233,809 (Graham); 4,259,190 (Fahey); 4,296,173 (Fahey); 4,259,190 (Fahey), all of which are hereby incorporated by reference. Another type of textile that can be treated with the slashing size formulation of the present invention is the bulked textile yarn. The bulked yarn has been produced by a process that causes loops or fluffiness in the strand by subjecting the yarn to pressurized fluid disturbance in a fluid jet such as an air jet. An example of such a bulking process for glass fiber yarn is disclosed in U.S. Pat. No. 4,371,584 (Fahey), hereby incorporated by reference.

The warp glass fiber strand yarn is produced by attenuating the glass fibers from molten streams of glass from small orifices in a bushing containing molten glass. The glass fibers are then cooled to some degree and the forming size composition is applied to the glass fibers as they are drawn by an applicator, which can either be a belt or roll applicator or spray applicators. The size glass fibers are then gathered into one or more strands and wound onto a winder, which provides the force for attenuating the glass fibers from the bushing. The fibers are drawn from the bushing and wound onto a sleeve on the winder at a speed of around 4,000 to 6,000 feet per minute. The glass fiber strands are traditionally wound onto the forming package in nonparallel alignment to each other to facilitate the removal of the strands from the forming package. A plurality of the forming packages are then dried to remove enough moisture so that the strand can be removed from the forming package and the forming packages are then rewound onto bobbins with or without a twist being imparted to the strand. The strand from the bobbins or from the forming package could undergo the bulking process such as described in U.S. Pat. Nos. 3,672,947 and 3,730,137, which have been dedicated to the public and 4,003,111 which are all hereby incorporated by reference. A plurality of the bobbins of the glass fiber strand yarn or bobbins of the bulked yarn are beamed by winding many of the strands in parallel onto a beaming cylinder. The beams are available to supply warp yarn to a slashing operation for producing weavable warp yarn.

The glass fiber strand yarn can have the slashing size formulation applied to it after the yarn has been unwound from a beam on any conventional slashing machine such as a West Point Slasher available from West Point Foundry and Machine Company, P. O. Box 151, West Point, GA 31833 and a slashing machines available from Griffiths Foundry and Machine Company and slashing machines now or formerly available from Cocker Machine and Foundry Company. A dry split type slashing operation or wet split type slashing operation can be used although it is more advantageous, and, therefore, preferred to use the dry split type slashing operation.

In the slashing operation, the yarn can be removed from one or more beams and passed into a size box in a slashing machine, where the size box can be either single or multiple size boxes. The slashing size solution is present in the size box maintained at a temperature in the range of ambient or room temperature of about 20° C. to an elevated temperature of about 90° C. The solids content of the slashing size is in the range of about 3 to about 25 weight percent and preferably about 8 to about 10 weight percent. After removal of excess size solution from the treated yarns by passage between squeeze rolls, the treated yarn is dried by contact with multiple drying cans heated to a temperaure of around 100° to 150° C. The yarn coming from the heated cans are split by stationary lease rods, and wound as a weaving beam. This operation through the slashing machine is usually conducted at speeds of 10 to 100 meters per minute. In a wet slashing operation, the wet sized yarn are split and partially dried in a separated state on heated cans before being reassembled and completely dried on the conventional heated cans.

The dried slashing formulation present on the yarn is in an amount of add on of around 1 to around 7 weight percent of the treated glass fiber strand yarn as determined by loss on ignition (LOI). Lower amounts of add on do not adequately protect the warp yarn in weaving and higher amounts for continuous yarns do not provide any additional benefit and only increase the requirements for removing the dried residue from the warp yarn once the weaving is completed. In the case of staple yarns, a higher add on of the slashing or warp sizing composition can be used to assist in keeping the short fibers together. The preferred amount of add on depends on the particular second film forming polymer that is utilized and the type of cleaning equipment to be used. Some cleaning equipment have an upper limit for removal of size residue of about 4 weight percent. The slashing size provides for absence of excessive foaming in the size box, no sticking of polymer on the drying can, clean splitting with little or no breakage at the lease bars and easy separation of the warp sized yarns when entering into the loom harness of the weaving machine.

The film coating of the dried residue of the slashing size present on the yarns can be characterized as flexible but tough rather than hard and brittle or hard and tough or hard and strong. The yield stress in psi of the flexible and tough coating is around at least 3,000 and the yield strain in percent is around 10% with a failure stress in psi of around at least 4,000 and a failure strain in percent of around 193%. A comparison of dry split slashing using the slashing size of the present invention and a slashing size having poly(vinyl alcohol) and ethylene glycol plasticizer was conducted. The results show little or no breakage of the film produced by the slashing size having the blend of the present invention and few, if any, fibers disturbed from the encapsulated yarn, whereas, the yarn having the film of a highly hydrolyzed, high molecular weight poly(vinyl alcohol) and ethylene glycol slashing size had around 50 percent of fibers removed from the treated yarn with numerous rupture points in the film visible at a magnification of 300 times.

The weaving of the warp yarn treated in accordance with the present invention may be performed with any conventional shuttle looms, air-jet looms, rapier looms or shuttless weaving machines. The fabric produced using the warp yarn of the present invention is first-quality fabric and was produced with good loom efficiency of 90% or greater with few loom stops and did not create a problem of the loom filling with powdery or paste-like deposits.

The fabric produced with the warp yarn of the present invention can be easily treated to remove the dried slashing formulation by heat cleaning. This heating is usually conducted at a temperature of around 900° to around 1300° F. (482° C. to 705° C.) for a period of time or around 10 to 180 seconds and is sufficient to volatilize the solids and remove them from the fabric by both carmelizing and/or coronizing and to soften the glass fibers in the fabric to set them in their new position. Of course, the carmelizing heat cleaning step and coronizing step can be conducted as separate heat cleaning steps. This process is described in greater detail in U.S. Pat. Nos. 2,845,364 and 4,139,357 both hereby incorporated by reference. Although heat cleaning is the beat way to remove the dried slashing formulation when present on glass fibers, if the slashing formulation present on other textiles, other means of finishing to remove the dried slashing formulation can be used such as scouring means useful for polyester yarns. Nonexclusive examples include scouring with detergent solutions and hot water.

In the preferred embodiment of the present invention, the components present in the slashing size formulation are the poly(vinyl alcohol), second film forming polymer, which is a polyurethane anionomer, and water. The ratio of poly(vinyl alcohol) and polyurethane is in the range of about 70:30 to about 95:5, and most preferably around 80:20. The preferred poly(vinyl alcohol) has a medium molecular weight of around 77,000 to 79,000 and a partial hydrolyzation of around 87 to 89 percent.

The amount of water preferably present in the slashing size is in the range of about 90 to 92 weight percent of the size.

The slashing size is prepared in a heated tank having differential speed mixing blades. About 50 percent of the water, which is deionized or distilled water or added to the mixing tank and the mixer is started. A small amount of emulsified nonsilicone defoamer such as that available as Colloid 694, which is prepared by adding one part of hot water and 150 to 1 part of defoamer is added to the tank in an amount of around 1 to 100 ounces. The poly(vinyl alcohol) is added slowly with a uniform feeding rate of around 50 pounds in around 10 minutes. Since the poly(vinyl alcohol) is water-soluble in cold water, the feed rate with limited mixing should not be too fast because such a feed rate will cause lumpy, undissolved particle size material. The temperature of the heated tank was set to around 210° F. (99° C.) and the mixture was heated for around 30 minutes. The mixture was then cooled by adding cold distilled water or deionized water to approximately 155° F. (68° C.) to 160° F. (71° C.) where an air mixture can be used to rapidly evaporate heat from the mix. The polyurethane anionomer, which is self-emulsifiable is added to the mixture. The remaining amount of the water is added that is needed to bring the slashing size formulation to the desired total solids and/or to the final desired volume. The slashing size is then transferred to the size box of a slashing machine for application to glass fiber strand yarn.

Glass fiber strand yarn having a construction of G-fiber having a filament diameter of around 9 microns and around 400 filaments per strand and having the dried residue of a starch oil sizing composition and being twisted with a 0.7 to 1 Z-twist is treated with the slashing size in a dry slashing operation. The amount of add on of the size is in the range of about 1 to about 7 weight percent of the treated glass fiber strand yarn after the yarn is dried on the heated cans and split. The warp yarn produced with the slashing size of the present invention according to the process of the present invention is wound onto the weaver's beam and is ready for weaving. The slashed yarn provides a material that can be woven and heat cleaned for use in electric circuit board applications.

The following examples are given for illustrative purposes and are not meant to be limiting of any of the apspects of the present invention. The performance of warp yarn in slashing is very sensitive to the slashing formulation, amount of add on of the slashing formulation, slashing machinery, and the loom used to weave the fabric. Therefore, in comparing data which were generated for the slashing formulations, the comparisons must be limited to similar slashing machinery and similar looms.

Slashing sizes having the formulation shown in Table 1 were used to treat glass fiber strand yarn having a G-75 construction with a 0.7 to 1 Z-twist and a residue of a starch oil forming size composition. The slashing was dry split slashing and the fabric woven with the treated warp yarn was woven on an air jet loom and the resultant fabric was heat cleaned. The performance of the slashing size yarn during slashing and the weaving evaluation of the slashed yarns are also given in Table I.

TABLE IA

SLASHING SIZE COMPOSITIONS FOR DRY SLASHING AND WOVEN ON INVESTA LOOM

|  | EXAMPLE 1<br>Vinol 53 poly(vinyl<br>alcohol) and Carbowax<br>300 polyethylene glycol | EXAMPLE 2<br>Vinol 53 poly(vinyl<br>alcohol) and Witcobond<br>234 polyurethane | EXAMPLE 3<br>Vinol 53 poly(vinyl<br>alcohol) and Witcobond<br>216 polyurethane | EXAMPLE 4<br>Vinol 53 poly(vinyl<br>alcohol) and Resyn 1207<br>poly(vinyl acetate) |
|---|---|---|---|---|
| Ratio of compound | 90/10 | 80/20 | 80/20 | 80/20 |
| Percent Solids, where the remainder in water | 7.46 | 7.60 | 7.44 | 6.95 |
| Total yards of Yarn Per end | 500 | 500 | 500 | 500 |
| Tensile lbs. | 10.3 | 9.0 | 9.0 | 7.8 |
| Percent LOI | 2.6 | 3.2 | 3.0 | 3.1 |
| Slashing operation Mechanical No. of stops | NONE | NONE | NONE | 2 |
| Chemical Performance of yarn | Easy split, flex hand | Easy split, flex hand | Easy split, flex hand | Hard split, brittle sandy hand |
| Weaving operation Total loom stops including warp and fill stops | 14 | 2 | 13 | 34 |
| Fabric Rating | B/B− | B/B− | B/C− | C/D |
| Overall rating | 3 | 1 | 2 | 6 |

|  | EXAMPLE 5<br>Vinol 53 poly(vinyl<br>alcohol) and Rhoplex 1789<br>polyacrylate | EXAMPLE 6<br>Gelvatol 20-60 poly(vinyl<br>alcohol) and Amylose HE-15<br>UZ starch and Carbowax 300<br>polyethylene glycol | EXAMPLE 7<br>Vinol 53 poly(vinyl<br>alcohol) and Witcobond 234<br>polyurethane |
|---|---|---|---|
| Ratio of compound | 80/20 | 66/33/10 | 60/40 |
| Percent Solids, where the remainder in water | 7.15 | 8.98 | 7.70 |
| Total yards of Yarn Per end | 500 | 500 | 500 |
| Tensile lbs. | 7.8 | 8.5 | 7.1 |
| Percent LOI | 3.0 | 3.2 | 3.2 |
| Slashing operation Mechanical No. of stops | NONE | NONE | 1 |
| Chemical Performance of yarn | Harder, brittle | Easy split, flex hand | Easy split, flex hand |
| Weaving operation Total loom stops including warp and fill stops | 21 | 16 | 28 |
| Fabric Rating | C−/D | B− | — |
| Overall rating | 5 | 4 | 7 |

In Table IA, the slashing was conducted at a yarn speed of 50 yards per minute and the temperature of the size in the size box was 110° F. (43.3° C.). The pressure of the squeeze roll in the slashing operation was 5 psi and the temperature of the drying cans was 250° F. (121° C.) for the Teflon ® coated can and 280° F. (138° C.) for the second set of cans. The tensioning of the yarn during the slashing operation for this set of examples was nonuniform tension from the left side to the right side of the beam. In the air jet weaving operation, the filling speed of the fill yarn in yards per minute was 485 and the fabric take off speed was 10 inches/minute, and the fabric construction was 32 picks per inch. In regards to the fuzz grading, A is the best grade and D is a poorer grade and regarding the overall rating, the best rating is a 1 with the poorer ratings having higher whole numbers. As is shown in Table I, the yarn treated with the slashing formulation comprising the blend of the poly(vinyl alcohol) and polyurethane had two of the best ratings in the group. The yarn treated with plasticized poly(vinyl alcohol) had similar ratings. Although the add on as measured by percent LOI was lower for the yarn treated with the poly(vinyl alcohol) plasticized with polyethylene glycol, the higher number of stops may not have been due to this difference. Data in later tables show such a difference in LOI was not so responsible. Clearly, the yarn treated with the blend of poly(vinyl alcohol) and polurethane performed better than yarn treated with blends of poly(vinyl acetate) or poly(vinyl alcohol) and poly- acrylates or poly(vinyl alcohol) and, starch and polyethylene glycol. The overall rating is based primarily on the total number of loom stops. The poorer performance for the yarn treated with a 60/40 blend of poly(vinyl alcohol) and polyurethane shows that for that particular polyurethane, the ratio should be greater than 60/40.

Table 1B presents data of the film properties of various slashing or warp sizing blends of Table I.

TABLE IB

| | Film Properties of Warp Size Formulas | | | | |
|---|---|---|---|---|---|
| EXAMPLE | Elong. % | Yield Strength (PSI) | Ultimate Strength (PSI) | Ultimate Elong. (%) | Shore "D" Hardness |
| Poly(vinyl alcohol) alone | 20 | 5788 | 4571 | 40 | 58 |
| 1 | 60 | 1983 | 3400 | 298 | 49 |
| 2 | 25 | 1863 | 2433 | 264 | 42 |
| 3 | 20 | 3708 | 3950 | 208 | 52 |
| 4 | 30 | 5018 | 3972 | 82 | 57 |
| 5 | 30 | 4291 | 4132 | 166 | 58 |
| 6 | — | — | 4300 | 54 | 50 |
| 7 | 20 | 1350 | 2925 | 302 | 52 |

The improvement in film properties of Examples 2, 3, and 7 in Table 1B over the poly(vinyl alcohol) sample is apparent from the reduction in yield strength, ultimate strength and Shore "D" hardness with very good increases in ultimate elongation percents over that for poly(vinyl alcohol). One sample of the yarn treated with the blend of poly(vinyl alcohol) and polyurethane, sample No. 2, even surpassed the yarn treated with poly(vinyl alcohol) that was plasticized with polyethylene glycol, sample No. 1 in the ultimate elongation property.

The strength for ultimate strength (PSI) are based on the original cross-sectional radius of the film sample tested. All the tests were conducted by procedures known to those skilled in the art.

Table II presents data showing the tensile stength of yarn treated with the slashing size formulation listed. All of the glass fiber strands treated with the slashing formulation had already been sized with a forming size having a starch oil composition.

TABLE II
TENSILE STRENGTHS OF TREATED GLASS FIBER STRAND YARN

| Aqueous Slashing Size Polymer Components | Tensile Strength (psi) |
|---|---|
| Poly(vinyl alcohol) | 14.8 |
| Poly(vinyl alcohol) 90 Polyethylene glycol 10 | 14.9 |
| Poly(vinyl alcohol)- acrylate copolymer | 11.7 |
| Poly(vinyl alcohol)- acrylate copolymer 90- polyethylene glycol 10 | 13.3 |
| Poly(vinyl alcohol) 80 Cationic polyurethane 212 - 20 | 14.7 |
| Poly(vinyl alcohol) 80 parts Cationic polyurethane 216 - 20 parts | 16.8 |
| Poly(vinyl alcohol) 80 parts Anionic polyurethane 20 parts | 15.1 |
| Poly(vinyl alcohol) 65 Anionic polyurethane 35 | 16.5 |
| Poly(vinyl alcohol) 80 Anionic polyurethane 20 | 14.7 |

The poly(vinyl alcohol) has a medium molecular weight and was partially hydrolized and is commercially available as Vinol 53 product from Air Products Co. The polyurethanes were the Witcobond products from Witco Chemical Co.

Table II shows improved tensile strengths of three out of six yarns treated with the slashing sizing composition having the blend of poly(vinyl alcohol) and polyurethane over yarn treated with poly(vinyl alcohol) alone or a plasticized poly(vinyl alcohol) such as the poly(vinyl alcohol) and polyethylene glycol blend. The other three yarns treated with the poly(vinyl alcohol) and polyurethane blend had comparable tensile strengths to the yarns treated with poly(vinyl alcohol) and plasticized poly(vinyl alcohol).

Table III presents data for a dry split slashing operation, where the speed of slashing was 60 yards per minute. The glass fiber strand that was slashed was a G-75 1.0 with a 0.7 Z-twist on a slasher available from West Point Foundry. The size box temperatures included a temperature on the bottom size box of 145° F. (63° C.) and a temperature on the top size box of 150° F. (66° C.), and a pressure on the squeeze roll of 8 psi. The temperatures of the heating cans were 210° F. (99° C.) for the Teflon ® coated can and 260° F. (127° C.) for the second set of cans and 300° F. (149° C.) for the third set of cans. The tension on the yarn in grams was 85 for creel to size box, 175 for size box to drying can and 250 before take up. The warp yarn treated with the slashing size was used to weave fabric in an air jet Invest loom having a model number of P-115.

The results of Table III show that the yarn treated with the slashing size having a blend of poly(vinyl alcohol) and polyurethane or a copolyester performed better in weaving because of fewer warp stops than the plasticized poly(vinyl alcohol), mixture which was discontinued due to excessive fuzz, and better than a plasticized poly(vinyl alcohol) acrylate copolymer because this material gave a hard split in slashing.

TABLE III
(New West Point Slasher)

| | EXAMPLE 1 Poly(vinyl alcohol) acrylate copolymer and ethylene glycol | EXAMPLE 2 Poly(vinyl alcohol) acrylate copolymer and ethylene glycol | EXAMPLE 3 Poly(vinyl alcohol) and polyurethane (Witcobond 290 H material) | EXAMPLE 4 Poly(vinyl alcohol) and ethylene glycol | EXAMPLE 5 Poly(vinyl alcohol) and cationic polyurethane |
|---|---|---|---|---|---|
| Ratio of compounds | 90/10 | 88/12 | 80/20 | 90/10 | 80/20 |
| Percent solid | 7.40 | 6.57 | 8.69 | 7.42 | 7.13 |
| Viscosity Cps/F.° | 35/110 | 22/110 | 35/110 | 65/110 | 30/110 |
| Total Yards | 1000 | 1000 | 1000 | 1000 | 1000 |
| Tensile lbs. | 9.5 | 8.9 | 9.5 | 9.6 | 8.9 |
| Percent LOI | 2.35 | 2.25 | 2.78 | 2.51 | 2.18 |
| No. of stops during slashing | 2 | 1 | 2 | 3 | 1 |
| CHEMICAL PERFORMANCE OF YARN | | | | | |
| | Hard split | Medium hard split | Witcobond 290H coagulated during slashing, so further slashing was terminated | Medium hard split | Good, pleasant, hard, easy split |
| WEAVING PERFORMANCE OF YARN | | | | | |
| Total yards/min | 848 | 800 | 850 | 709 | 605 |
| No. of warp stops | 20 | 38 | 26 | 35 | 21 |
| No. of Filling stops | 13 | 28 | 8 | 26 | 14 |
| Total stops | 33 | 66 | 34 | 61 | 35 |
| Fuzzy warp ends | 14.7 | 30.0 | 12.4 | 21.4 | 20.5 |
| Fabric Fuzz Grade | C | C | C | C | C− |
| Overall rating | 3 | 6 | 2 | 5 | 4 |

| EXAMPLE 6 Poly(vinyl alcohol) | EXAMPLE 7 Poly(vinyl alcohol) | EXAMPLE 8 Poly(vinyl alcohol) | EXAMPLE 9 Poly(vinyl acetate) acrylate copolymer poly(vinyl alcohol) mixture and |

TABLE III-continued (New West Point Slasher)

| | and anionic polyurethane | and copolyester | and ethylene glycol | ethylene glycol |
|---|---|---|---|---|
| Ratio of compounds | 80/20 | 80/20 | 50/50/10 | 33/33/33/20 |
| Percent solid | 7.29 | 7.40 | 7.25 | 10.7 |
| Viscosity Cps/F.° | 30/110 | 70/110 | 20/110 | 45/110 |
| Total Yards | 1000 | 1000 | 1000 | 1000 |
| Tensile lbs. | 9.0 | 9.1 | 9.1 | 9.67 |
| Percent LOI | 2.35 | 2.40 | 2.31 | 3.15 |
| No. of stops during slashing | 0 | 0 | 0 | 3 |
| CHEMICAL PERFORMANCE OF YARN | | | | |
| | Good, pleasant hard, easy split | Good, pleasant hard, easy split | Good, pleasant hard, easy split | Very hard, split sandy hand |
| WEAVING PERFORMANCE OF YARN | | | | |
| Total yards/min | 929 | 845 | Discontinued due to excess fuzz | Discontinued due to excess hard size |
| No. of warp stops | 46 | 29 | Discontinued due to excess fuzz | Discontinued due to excess hard size |
| No. of Filling stops | 24 | 16 | Discontinued due to excess fuzz | Discontinued due to excess hard size |
| Total stops | 70 | 35 | Discontinued due to excess fuzz | Discontinued due to excess hard size |
| Fuzzy warp ends | 34.3 | 7.1 | Discontinued due to excess fuzz | Discontinued due to excess hard size |
| Fabric Fuzz Grade | C | C | Discontinued due to excess fuzz | Discontinued due to excess hard size |
| Overall rating | 7 | 1 | 8 | 9 |

Table IV presents data showing the use of the slashing size formulation and glass fiber yarn treated with the slashing size formulation of the present invention, where the slashing and separation of the treated yarn is done by wet splitting. In Table IV, the total yards of yarn produced was 500, the wet split was a 4-way wet split. In the slashing, the speed was 85 yards per minute and in the size box the temperature was 120° F. (48.9° C.) in the bottom box and in the top box 125° F. (52° C.). The pressure on the squeeze roll to remove excess slashing size from the yarns was 8.5 psi. In the drying segment of the slashing operation, the Teflon ® coated can had a temperature of 280° F. (138° C.) and the second and third heated cans had temperatures of 290° F. (143° C.). The tension on the yarn in grams was 85 from creel to size box and 175 from size box to drying can and 250 before take up. In weaving, the air jet loom was used for the treated G-75 1.0.7, Z-twisted yarn having a forming size of a starch oil. For example 6 of Table IV, the total amount of yarn produced was 1,000 yards, and example 6 had a temperature in the bottom sizing box of 115° F. (46° C.). The tensile on the yarn during slashing was 85 grams from creel to size box, 75 grams from size box to drying can and 250 grams before take up.

TABLE IV

SLASHING SIZE FORMULATIONS AND WET SPLIT SLASHING AND WEAVING PERFORMANCE FOR G-75 1.0.72 GLASS FIBER YARN

| | EXAMPLE 1 Vinol 205 poly-(vinyl alcohol) | EXAMPLE 2 Vinol 53 poly(vinyl alcohol) and cationic polyurethane Witcobond 212 material | EXAMPLE 3 Vinol 53 poly-(vinyl alcohol) | EXAMPLE 4 Vinol 53 poly-(vinyl alcohol) | EXAMPLE 5 Vinol 53 poly(vinyl alcohol) and Witcobond 212 cationic polyurethane |
|---|---|---|---|---|---|
| Ratios of compounds | 100 | 90/10 | 100 | 100 | 90/10 |
| Viscosity scale reading at °F. which when multiplied by 2 equals Cps/F.° | 13/110 | 15/110 | 18/110 | 28/110 | 17/110 |
| Percent solid | 7.25 | 7.00 | 5.43 | 7.15 | 6.75 |
| Percent LOI | 2.51 | 2.75 | 2.43 | 2.98 | 2.82 |
| Tensile lbs. | 6.8 | 9.0 | 8.0 | 9.0 | 9.8 |
| MECHANICAL PERFORMANCE OF YARN | | | | | |
| No. of stops during slashing | NONE | NONE | 1 stop | NONE | 2 stops |
| CHEMICAL PERFORMANCE OF YARN | | | | | |
| | Smooth run, pleasant nonsandy hand | Smooth run, pleasant nonsandy hand | Smooth run, pleasant, nonsandy hand | Smooth run, pleasant, nonsandy hand | Several ends broken; trial discontinued |
| WEAVING PERFORMANCE OF YARN | | | | | |
| Total Yards/Min | 450 | 419 | 524 | 488 | 214 |
| No. of Warp Stops | 13 | 17 | 10 | 2 | 1 |
| No. of Filling Stops | 1 | 13 | 5 | 2 | 4 |

TABLE IV-continued
SLASHING SIZE FORMULATIONS AND WET SPLIT SLASHING AND WEAVING PERFORMANCE FOR G-75 1.0.72 GLASS FIBER YARN

| | EXAMPLE 1<br>Vinol 205 poly-<br>(vinyl alcohol) | EXAMPLE 2<br>Vinol 53 poly(vinyl alcohol)<br>and cationic polyurethane<br>Witcobond 212 material | EXAMPLE 3<br>Vinol 53 poly-<br>(vinyl alcohol) | EXAMPLE 4<br>Vinol 53 poly-<br>(vinyl alcohol) | EXAMPLE 5<br>Vinol 53 poly(vinyl<br>alcohol) and Witcobond<br>212 cationic polyurethane |
|---|---|---|---|---|---|
| Total Stops | 14 | 30 | 15 | 4 | 4 |
| Fuzzy Warp Ends | " | " | Moderate | Low | Excessive |
| Fabric Fuzz Grade | B/C | B−/C | B− | B/B− | B− |
| Overal Rating | 5 | 6 | 3 | 1 | 4 |

As shown in Table IV, even where the slashing operation is a wet split operation, the slashing size formulation of the present invention and the yarn treated with the slashing size performs comparably to yarn treated with poly(vinyl alcohol). The poly(vinyl alcohol) treated yarns had overall ratings of 1, 3 and 5 and the yarns treated with the blend of the present invention had overall ratings of 2 and 4.

The foregoing has described a warp size for textiles to produce sized warp yarn having adequate protection for good weavability and also having good integrity and good abrasion resistance. The warp size achieves these objectives by the use of a polymeric blend comprising poly(vinyl alcohol) and a second film forming polymer having a glass transition temperature of less than 70° C. and having a fine particle size and being dispersible with poly(vinyl alcohol), where examples of such polymers include polyurethane ionomers and co-polyesters. The treated warp yarn is preferably glass fiber yarn already having a forming size composition of at least a lubricant and possibly a film forming material and other forming size components. The preferred use of the woven glass fiber strand fabric is in reinforcement for electric circuit boards.

We claim:

1. A textile yarn warp sizing composition, comprising:
   a. a major amount of the solids of the composition of one or more water soluble, emulsifiable or dispersible fiber forming poly(vinyl alcohol) polymers,
   b. an amount of about 1 to about 50 weight percent of the solids of the composition of a water soluble, emulsifiable or dispersible second film forming polymer dispersible with the poly(vinyl alcohol) having a Tg of less than 70° C. and present in a particle size of less than 5 microns, and
   c. water in an amount to give a solids content to the composition in the range of about 3 to 25 weight percent.

2. Aqueous warp sizing of claim 1, wherein the second film forming polymer is selected from the group consisting of polyurethane ionomers and copolyesters.

3. Aqueous warp sizing of claim 1, wherein the ratio of the poly(vinyl alcohol) to second film forming polymer is in the range of about 70:30 to about 99:1.

4. Aqueous warp sizing of claim 1, wherein the poly(vinyl alcohol) is partially hydrolyzed and has a medium molecular weight.

5. Aqueous warp sizing of claim 1, wherein the polyurethane ionomer is produced by reacting organic aliphatic diisocyanates with tri or tetraethylene glycol and aliphatic glycols having carboxyl, carboxylate or amine groups.

6. Aqueous warp sizing of claim 1, wherein the second film forming polymer is a copolyester of an amino sulfo isophthalic acid and aliphatic or cycloaliphatic dicarboxylic acids.

7. Aqueous warp sizing of claim 1, wherein there is present one or more lubricants.

8. Aqueous warp sizing of claim 1, wherein there is present one or more plasticizers.

9. Aqueous warp sizing of claim 1, wherein there is present one or more lubricants and one or more plasticizers.

10. Aqueous warp sizing of claim 1, wherein there is present a mixture of poly(vinyl alcohols).

11. Textile yarn having the dried residue of warp sizing of claim 1.

12. A glass fiber warp sizing composition, comprising:
   a. a major amount of the solids of one or more film forming poly(vinyl alcohol) polymers that are water soluble, emulsifiable or dispersible,
   b. a minor amount of the solids of a water soluble, emulsifiable or dispersible second film forming polymer selected from the group consisting of polyurethane ionomers and copolyesters present in an average particle size of less than 5 microns, wherein the ratio of the poly(vinyl alcohol) to second film forming polymer is in the range of about 70:30 to about 99:1,
   c. water in an amount to give a solids content to the composition in the range of about 3 to 25 weight percent.

13. Treated glass fiber strand yarn, comprising:
   a. individual glass fibers having a substantially dried residue of a glass fiber lubricant, and
   b. a film coating substantially encapsulating a plurality of the lubricant treated glass fibers, wherein the coating is a substantially dried residue of a warp sizing composition having:
      (1) one or more film forming poly(vinyl alcohol) polymers that are water soluble, emulsifiable, or dispersible in a major amount of the solids of the aqueous warp sizing,
      (2) a water soluble, emulsifiable or dispersible second film forming polymer compatible with the poly(vinyl alcohol) having a Tg of less than 70° C. having an average particle size of less than 5 microns and that is dispersible with poly(vinyl alcohol) in a minor amount of solids of the aqueous warp sizing composition, and
      (3) water in an amount to give a solids content to the warp sizing composition in the range of about 3 to 25 weight percent.

14. Treated glass fiber strand of claim 13, wherein the second film forming polymer is selected from the group consisting of polyurethane ionomers and copolyesters.

15. Treated glass fiber strand of claim 13, wherein the poly(vinyl alcohol) is partially hydrolyzed and has a medium molecular weight.

16. Treated glass fiber strand of claim 13, wherein the warp sizing has present one or more lubricants.

17. Treated glass fiber strand of claim 13, wherein the second film forming polymer has present carboxylic or amino groups.

18. Treated glass fiber strand of claim 13, wherein the warp sizing has present one or more lubricants and one or more plasticizers.

19. Process of producing treated glass fiber strand yarn suitable for use as warp yarn, comprising:
 (a) attenuating a plurality of glass fibers from molten streams of glass through orifices in a bushing,
 (b) treating the glass fibers with an aqueous composition of a glass fiber lubricant and film forming material,
 (c) gathering the fibers into one or more strands,
 (d) collecting the one or more strands on a forming tube on a winder,
 (e) drawing a substantial amount of the moisture from the glass fiber strands on the forming tube to enable the strand to be easily removed from the tube;
 (f) rewinding the glass fiber strand with or without a twist,
 (g) beaming a plurality of the rewound strands,
 (h) unwinding the plurality of rewound strands in the beam,
 (i) treating the plurality of strands with an aqueous containing warp sizing composition having as the major amount of the solids of the composition one or more water soluble, emulsifiable or dispersible film forming poly(vinyl alcohol) polymers, and as a minor amount of the solids a second film forming polymer dispersible with the poly(vinyl alcohol) polymer and having a Tg of less than 70° C. and having in an average particle size of less than 5 microns, and water in an amount to give a solids content to the warp sizing composition in the range of about 3 to about 25 weight percent,
 (j) drying the treated strands to remove a substantial amount of the moisture
 (k) splitting the strands into distinct treated strands,
 (l) rewinding the strands onto a weaver's beam.

20. Treated glass fiber strand warp yarn produced by the process of claim 19.

* * * * *